United States Patent [19]

Hansen et al.

[11] Patent Number: 5,303,406
[45] Date of Patent: Apr. 12, 1994

[54] NOISE SQUELCH CIRCUIT WITH ADAPTIVE NOISE SHAPING

[75] Inventors: Kenneth A. Hansen, Keller, Tex.; James D. Brake, Canton, Mich.

[73] Assignee: Motorola, Inc., Schaumburg, Ill.

[21] Appl. No.: 692,834

[22] Filed: Apr. 29, 1991

[51] Int. Cl.⁵ .............................................. H04B 1/16
[52] U.S. Cl. ..................................... 455/222; 455/220
[58] Field of Search ............... 455/212, 213, 218–225, 455/35.1, 36.1, 37.1

[56] References Cited

U.S. PATENT DOCUMENTS

| | | | |
|---|---|---|---|
| 3,004,156 | 10/1961 | Coleman et al. | 455/213 |
| 4,411,021 | 10/1983 | Yoakum | 455/222 |
| 4,628,539 | 12/1986 | Selwa | 455/194 |
| 4,761,829 | 8/1988 | Lynk, Jr. et al. | 455/213 X |
| 5,020,141 | 5/1991 | Meszko | 455/213 X |

Primary Examiner—Reinhard J. Eisenzopf
Assistant Examiner—Chi Pham
Attorney, Agent, or Firm—Robert S. Babayi

[57] ABSTRACT

A noise squelch circuit for a radio receiver (100) includes an adaptive filter (204) for shaping frequency characteristics of a demodulator out put (115) according to factors which effects squelch sensitivity. Such factors may include channel spacing of the receiver, received signal strength level, received signal deviation, and SINAD. The adaptive filter (204) comprises a switched capacitor filter, the response of which may be controlled by a control signal (212) according to one or more of such factors.

4 Claims, 2 Drawing Sheets

NOISE SQUELCH CIRCUIT WITH ADAPTIVE NOISE SHAPING

TECHNICAL FIELD

This invention relates generally to the field of radio receivers and in particular to circuits for squelching noise in such receivers.

BACKGROUND

In radio frequency (RF) communication systems, an audio message is modulated onto a carrier signal to provide a communication signal which is transmitted over air by means of an RF transmitter. A radio receiver receives the communication signal and demodulates it to recover the audio message which is presented to a speaker through an audio circuit.

Generally, when the received communication signal (or carrier signal) has little or no strength, the output of the demodulator comprises substantial noise in the 10-20 KHz range which is detected and mutes the audio path to the speaker. Squelching the radio prevents undesired noise from being heard, which also decreases power consumption of the receiver because no current is drawn by the speaker.

In the radio receivers, a noise squelch circuit generally provides a squelch signal which disables the audio circuit based on the noise power at the demodulator output. The received signal strength level which unsquelches a radio is commonly referred to as squelch sensitivity of the receiver. The squelch sensitivity of the receiver varies based on the noise characteristics of the demodulator output. Usually, the squelch sensitivity of the receiver is set to different levels by varying an attenuator which sets a threshold for unsquelching the radio.

Conventionally, the noise at the demodulator output after being frequency shaped and rectified is compared to the threshold to determine whether the squelch signal should be generated or not. However, because the noise characteristics of the demodulator output are not stable and may vary under certain conditions, the conventional squelch circuits may squelch or unsquelch the radio prematurely. The noise characteristic variations may depend on such factors as the channel spacing of the receiver (e.g. 25 KHz, 12.5 KHz), the received signal strength level, signal-to-noise ratio of the received signal (i.e. SINAD), and the deviation of the received communication signal (especially in frequency modulation (FM) communication systems). The noise characteristic variations could degrade radio receiver operation unless receiver hardware is modified. Therefore, numerous receiver circuit hardware may be required for accommodating the various operating circumstances. Accordingly, it is desired to improve squelch response of the radio receiver without extensive hardware modifications.

SUMMARY OF THE INVENTION

Briefly, according to the invention, a noise squelch circuit for a radio receiver includes a demodulator for demodulating a received communication signal. The demodulator is coupled to a filter means which is adaptively programmed by a control signal to shape frequency characteristics at the demodulator output to correspond to channel spacing of the receiver, received signal strength, or other related criteria. The demodulator output frequency characteristics are therefore shaped for optimum squelch performance. A squelch means is coupled to the filter means and provides a squelch signal to squelch the radio receiver.

DETAILED DESCRIPTION OF THE PREFERRED EMBODIMENT

Figure 1:
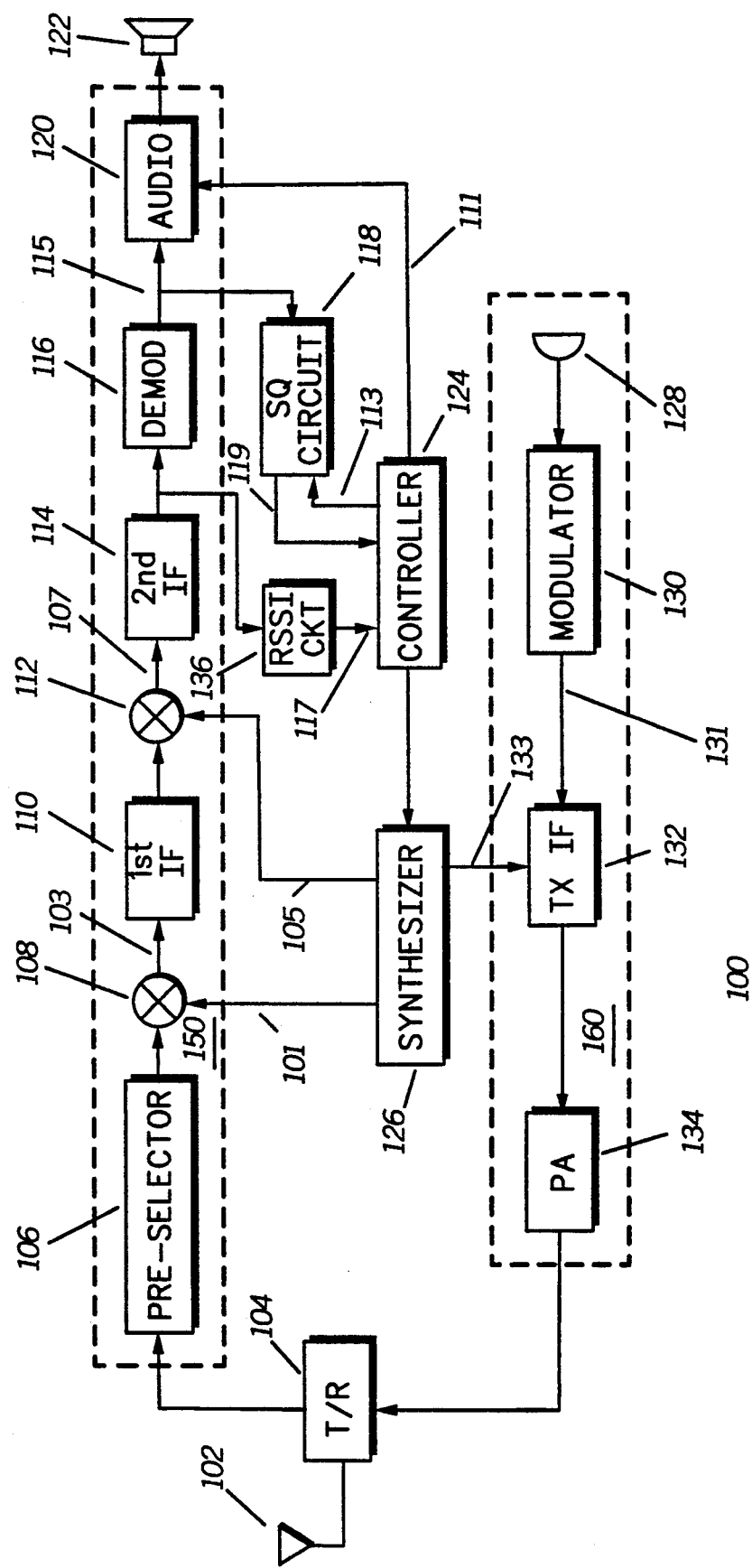
FIG. 1 shows a block diagram of a radio which includes noise squelch circuit of the present invention.

Referring to FIG. 1, the block diagram of a radio 100 which incorporates noise squelch circuit of the present invention is shown. The radio 100 comprises a microprocessor controlled radio which may comprise a portable or a mobile unit. The radio 100 operates in receive or transmit modes to provide two-way frequency modulated (FM) communication within a well-known communication system. Although the operation and circuitry of a FM radio 100 is well known, a brief description will help in understanding of the present invention. In the receive mode, the radio 100 receives a communication signal via an antenna 102 and routes to a receiver section 150 (shown in dotted line) which comprises a well-known double-conversion FM receiver. The T/R switch 104 couples the received communication signal to a well-known preselector block 106. The preselector block 106 comprises a well-known passband filter which provides selectivity for the received communication signal. A well-known 1st-mixer 108 provides a 1st-IF signal 103 by mixing the received communication signal with a first local oscillator signal 101. The first oscillator signal 101 is provided by a well-known frequency synthesizer 126. The controller 124 is programmed to control the entire operation of the radio 100 and sets the synthesizer 126 to generated appropriate receive and transmit frequency local oscillator signals. A 1st-IF section 110 filters the 1st-IF signal 103 and couples it to a 2nd-mixer 112. The 2nd-mixer 112 receives a 2nd-oscillator signal 105 from the synthesizer 126 to provide a 2nd-IF signal 107. A 2nd-IF section filters the 2nd-IF signal 107 and applies it to a demodulator 116 as well as a well-known received signal strength indicator (RSSI) circuit 136. The output of the RSSI circuit 136 is applied to the controller 124 for further processing. The demodulator 116 operates in a well-known manner to recover the message or baseband signal. Demodulator output 115 is applied to a squelch circuit 118 as well as an audio circuit 120. It is well known that when little or no communication signal is present, the receiver must be squelched in order to prevent white noise generated at the demodulator output 115 from reaching beyond the audio circuit 120. When the received communication signal strength level exceeds a predetermined threshold, the receiver unsquelches and enables the audio circuit 120 to allow the message signal to reach a speaker 122. The squelch circuit 118 of the present invention, as will be described later, includes an adaptive filter which shapes frequency characteristics of the demodulator output 115 in response to a control signal 113 as provided by the controller 124. The control signal 113 corresponds to one or more factors which affect the squelch sensitivity at the demodulator output 115, such as receiver channel spacing and/or the received communication signal strength level. The squelch circuit 118 provides a squelch detect signal 119 to the controller 124 which after processing determines squelch status and provides a squelch signal 111 to enable or disable the audio circuit 120. The audio circuit 120, when enabled, presents the message signal to the speaker 122 which renders it audible for the users.

In the transmit mode, a transmitter section 160 (shown in dotted line) includes a microphone 128 for receiving the message signal for transmission. Output of the microphone 128 is applied to a well-known FM modulator 130 to provide a modulating signal 131 for a transmitter IF section 132. The transmitter IF section 132 receives a carrier signal 133 from the synthesizer 126 and couples it to a transmitter power amplifier 134. The transmitter power amplifier 132 amplifies the output of the transmitter IF section 132 and applies it to the antenna 102 through the T/R switch 104.

Figure 2:
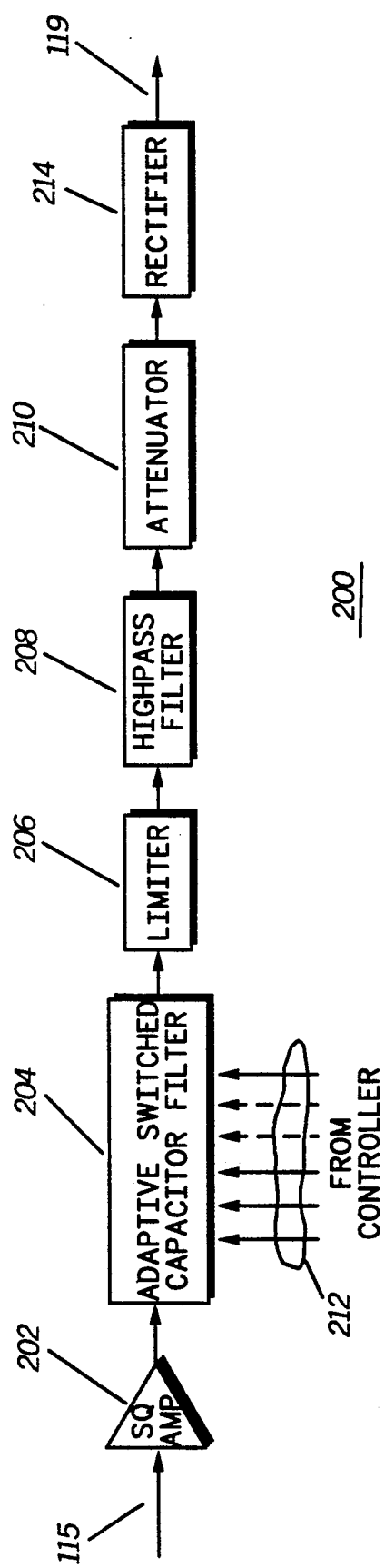
FIG. 2, shows a block diagram of the noise squelch circuit of the present invention.

Referring to FIG. 2, a block diagram of a squelch circuit 200 according to the present invention is shown. The squelch circuit 200 is coupled to the demodulator output 115 of the radio 100 of FIG. 1. A squelch amplifier 202 adjusts the demodulator output 115 to proper level and applies it to an adaptive filter 204. The adaptive filter 204 shapes frequency characteristics of the demodulator output, including the noise, and frequency characteristics in response to a control signal 212. The control signal 212 comprises a seven bit digital signal which is provided by the controller 124 of FIG. 1. The control signal 212 corresponds to one of several factors to shape the frequency characteristics of the demodulator output according to the bit pattern represented thereby. In the preferred embodiment of the invention, the adaptive filter performs pre-emphasis of the message signal and noise as well as shaping frequency characteristics of the demodulator output. A limiter 206 limits the output of the adaptive filter 204 and applies it to a high pass filter 208. The output of the high pass filter 208 is applied to an attenuator 210 which sets the squelch sensitivity of the receiver. A rectifier 214 receives the output of the attenuator 210 and provides the squelch detect signal 119. The squelch detect signal 119 is applied to the controller 124 of FIG. 1 for processing and determination of the squelch status.

According to the invention, the control signal 212 corresponds to one of a number of factors, such as receiver channel spacing, received signal strength level or the deviation of the received communication signal. The control signal 212 is generated based on one or more of these factors to shape the frequency response of the adaptive filter 204 so as to provide optimum squelch response for the radio 100 of FIG. 1. In the preferred embodiment, the adaptive filter 204 comprises a well-known switched capacitor filter the response of which may be controlled by seven data bits of the control signal 212. However, it is contemplated that non-discrete type filters may also be used for shaping the frequency characteristics of the modulator output 115. The controller 124 may generate the control signal 212 based on prestored information in its memory (e.g. channel spacing information stored in a volatile memory) or information received in real time (e.g. received communication signal strength level as provided by the RSSI circuit 136). One of ordinary skill in the art appreciates that the control signal 212 may be generated based on other criterions as well. Such criterions may include received signal deviation or received signal SINAD. The received signal deviation may be estimated by measuring the level of the demodulated output which corresponds to a deviation from the carrier signal. The SINAD measurement in the receiver is well known and may be accomplished by determining ratio of received signal level and noise level and distortion to the noise level and distortion.

The adaptive filter 204 in the preferred embodiment of the present invention includes primary and secondary programmable zero-pole filter stages. In this receiver implementation, the primary stage has a primary zero and a primary pole. The primary zero can be programmed to any of sixteen different frequencies geometrically spaced between 2 to 10 KHz, and the primary pole is at approximately one of 10, 16, 18, or 20 KHz. The secondary stage has a zero which is ganged to the primary zero. In the preferred embodiment of the present invention, the secondary pole is at 2.07 times that of the zeros. The purpose of ganging the stages is to prevent either pole frequency from being below a zero frequency so that a second order highpass response can be obtained.

Accordingly, the response of the adaptive filter 204 may be controlled to vary the frequency characteristics of noise at the demodulator output to achieve optimum squelch performance for a variety of channel spacings and under numerous received signal strength conditions. The squelch circuit 200 of the present invention therefore simplifies the circuit configuration of the radio receiver making it adaptable to function under different channel spacings and received signal conditions without having to provide hardware modifications.

What is claimed is:

1. A noise squelch circuit for a radio receiver, comprising:
    a demodulator for demodulating a received communication signal having a demodulator output;
    a filter means for adaptively shaping frequency characteristics of noise present at the demodulator output in response to a control signal, wherein said control signal corresponds to channel spacing of the radio receiver; and
    squelch means coupled to said filter means for squelching the radio receiver.

2. A noise squelch circuit for a radio receiver, comprising:
    a demodulator for demodulating a received communication signal having a demodulator output;
    a filter means for adaptively shaping frequency characteristics of noise present at the demodulator output in response to a control signal, wherein said control signal corresponds to deviation of the received communication signal; and
    squelch means coupled to said filter means for squelching the radio receiver.

3. A radio comprising:
    means for receiving a received communication signal;
    a demodulator for demodulating the received communication signal having a demodulator output;
    a filter means for adaptively shaping frequency characteristics of noise present at the demodulator output in response to a control signal, wherein said control signal corresponds to channel spacing of the radio; and
    squelch means coupled to said filter means for squelching the radio receiver.

4. A radio comprising:
    means for receiving a received communication signal;
    a demodulator for demodulating the received communication signal having a demodulator output;

a filter means for adaptively shaping frequency characteristics of noise present at the demodulator output in response to a control signal, wherein said control signal corresponds to deviation of the received communication signal; and squelch means coupled to said filter means for squelching the radio receiver.

* * * * *